(12) United States Patent
Chen

(10) Patent No.: US 10,957,224 B2
(45) Date of Patent: Mar. 23, 2021

(54) COVER FILM AND FLEXIBLE DISPLAY DEVICE

(71) Applicant: KunShan Go-Visionox Opto-Electronics Co., Ltd., Kunshan (CN)

(72) Inventor: Lingyan Chen, Kunshan (CN)

(73) Assignee: KunShan Go-Visionox Opto-Electronics Co., Ltd., Kunshan (CN)

(*) Notice: Subject to any disclaimer, the term of this patent is extended or adjusted under 35 U.S.C. 154(b) by 0 days.

(21) Appl. No.: 16/519,480

(22) Filed: Jul. 23, 2019

(65) Prior Publication Data

US 2019/0347965 A1  Nov. 14, 2019

Related U.S. Application Data

(63) Continuation of application No. PCT/CN2018/088654, filed on May 28, 2018.

(30) Foreign Application Priority Data

Aug. 31, 2017  (CN) .......................... 201710776517.3

(51) Int. Cl.
G09F 9/30 (2006.01)
G02F 1/1333 (2006.01)
(52) U.S. Cl.
CPC ........ G09F 9/301 (2013.01); G02F 1/133305 (2013.01)
(58) Field of Classification Search
None
See application file for complete search history.

(56) References Cited

U.S. PATENT DOCUMENTS

2004/0217702 A1  11/2004  Beeson et al.
2012/0169978 A1*  7/2012  Han .................. G02F 1/133553
349/113

(Continued)

FOREIGN PATENT DOCUMENTS

CN  1561149 A  1/2005
CN  103150965 A  6/2013

(Continued)

OTHER PUBLICATIONS

PCT Written Opinion of PCT/CN2018/088654 dated Aug. 30, 2018.

(Continued)

*Primary Examiner* — Christopher J Kohlman
(74) *Attorney, Agent, or Firm* — Rimon PC

(57) ABSTRACT

A cover film is applied to a flexible display device. The cover film includes a light incident surface and a light exit surface. A plurality of concaves are provided on the light incident surface. Each of the concaves includes a first portion, and the first portion is arch shaped. By providing the plurality of concaves with an arched structure on the cover film, the flexible display device changes a light path less during a bending process, and rainbow ripples or water ripples may be avoided, thereby improving user experience. In addition, since the plurality of concaves are the arched structures with a certain radian, the plurality of concaves have a certain concentrating effect, so that brightness of a visible region of the flexible display device can be enhanced.

18 Claims, 5 Drawing Sheets

(56) References Cited

U.S. PATENT DOCUMENTS

| | | | | |
|---|---|---|---|---|
| 2012/0224262 A1* | 9/2012 | Wu | ............... | G02F 1/133526 |
| | | | | 359/486.02 |
| 2015/0192731 A1* | 7/2015 | Kim | ............... | G02B 6/0045 |
| | | | | 362/628 |
| 2016/0202395 A1* | 7/2016 | Lee | ............... | G02B 5/0215 |
| | | | | 362/97.1 |
| 2016/0322403 A1 | 11/2016 | Gao et al. | | |
| 2017/0069878 A1 | 3/2017 | Hsieh et al. | | |
| 2017/0179207 A1 | 6/2017 | Sato et al. | | |

FOREIGN PATENT DOCUMENTS

| | | |
|---|---|---|
| CN | 203433760 U | 2/2014 |
| CN | 105633121 A | 6/2016 |
| CN | 106024704 A | 10/2016 |
| CN | 106104841 A | 11/2016 |
| CN | 106340523 A | 1/2017 |
| CN | 206332028 U | 7/2017 |
| KR | 101654650 B1 | 9/2016 |
| TW | 201716839 A | 5/2017 |

OTHER PUBLICATIONS

Chinese First Office Action for CN Application No. 2017107765173 dated Aug. 5, 2019.
Chinese Second Office Action for CN Application No. 201710776517.3 dated Aug. 5, 2019.
Taiwan First Office Action for TW Application No. 107125660 dated May 8, 2019.
PCT International Search Report dated Aug. 30, 2018 in International Application No. PCT/CN2018/088654.

* cited by examiner

COVER FILM AND FLEXIBLE DISPLAY DEVICE

CROSS-REFERENCE TO RELATED APPLICATIONS

This application is a continuation application of International Application No. PCT/CN2018/088654 filed on May 28, 2018, which claims priority to Chinese patent application No. 201710776517.3 filed on Aug. 31, 2017. Both applications are incorporated herein by reference in their entireties.

TECHNICAL FIELD

Exemplary embodiments of the present application relate to flexible display technologies, in particular to a cover film and a flexible display device.

BACKGROUND

With the development of Organic Light-Emitting Diode (OLED), bendable flexible display devices are being accepted by more and more people, and therefore, demands are also increasing. However, overall protection is particularly important for flexible display. For example, in a process of folding, especially, of bending, a light path changes during a light exit process, which may seriously affect visual experience of people.

A cover film in the flexible display device serves as a last barrier for the light path to be emitted. A light source is emitted by a display module and transmitted to a light emitted surface through an adjacent light incident surface, which not only guarantees light transmission efficiency, but also protects the display device. A structure of the cover film in the prior art is a flat structure, and when the flexible display device is bent, an output light path is changed greatly to form a phenomenon such as rainbow ripples, water ripples, or a decrease in screen contrast, thereby reducing user experience.

SUMMARY

In view of this, exemplary embodiments of the present application provide a cover film and a flexible display device for solving a technical problem that the existing cover film is not suitable for bending of the flexible display device and is prone to form an interference light path.

A cover film, applied to a flexible display device, includes a light incident surface and a light exit surface. A plurality of concaves are provided on the light incident surface, each of the concaves includes a first portion of an arch shape.

In a particular embodiment of the present application, a radian of the first portion is less than or equal to π.

In a particular embodiment of the present application, a height of the first portion is positively correlated with a distance between the light incident surface and the light exit surface.

In a particular embodiment of the present application, the height of the first portion is from 10 μm to 25 μm.

In a particular embodiment of the present application, a diameter of a maximum cross section of the first portion is from 10 μm to 25 μm.

In a particular embodiment of the present application, a shape of the first portion is spherical or groove-shaped.

In a particular embodiment of the present application, a distance between adjacent first portions is 1.2 times a diameter of a maximum cross section of the first portion.

In a particular embodiment of the present application, a shape of each of the concaves is hemispherical.

In a particular embodiment of the present application, each of the concaves further includes a second portion located between the first portion and the light incident surface.

In a particular embodiment of the present application, a longitudinal section of the second portion is rectangular or trapezoidal.

In a particular embodiment of the present application, a cross section of the second portion is rectangular or circular.

In a particular embodiment of the present application, a diffusion film is provided on the light exit surface.

The present application further provides a flexible display device including a display module and a cover film provided on the display module. The cover film includes a light incident surface and a light exit surface; a plurality of concaves are provided on the light incident surface, each of the concaves includes a first portion of an arch shape.

In a particular embodiment of the present application, the display module includes a plurality of pixel units; and a distribution of the plurality of concaves corresponds to a distribution of the plurality of pixel units.

According to the cover film provided by the present application, by providing the plurality of concaves with an arched structure on the cover film, the flexible display device changes a light path less during a bending process, and rainbow ripples or water ripples may be avoided, thereby improving user experience. In addition, since the plurality of concaves are the arched structures with a certain radian, the plurality of concaves have a certain concentrating effect, which can converge stray light or scattered light that has not been utilized effectively before, so that brightness of a visible region of the flexible display device can be enhanced and the user experience can be improved.

DETAILED DESCRIPTION

The technical solutions in embodiments of the present application are clearly and completely described in the following with reference to the accompanying drawings in the embodiments of the present application. It is obvious that the described embodiments are only a part of the embodiments of the present application, and not all of the embodiments. All other embodiments obtained by those skilled in the art based on the embodiments of the present application without creative efforts are within the scope of the present application.

Step numbers in the accompanying drawings are only used as reference numbers for the steps and do not indicate an execution sequence.

Figure 1:
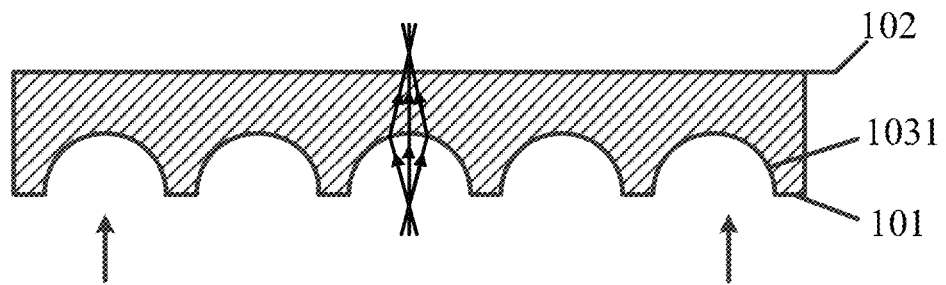
FIG. 1 is a front cross-sectional view of a cover film according to an embodiment of the present application.

FIG. 1 is a front cross-sectional view of a cover film according to an embodiment of the present application. As shown in FIG. 1, the cover film which is applied to a flexible display device according to an embodiment of the present application includes a light incident surface 101 and a light exit surface 102. A plurality of concaves are provided on one side of the light incident surface 101 in a direction toward the light exit surface 102. Each of the concaves includes a first portion 1031, and the first portion 1031 is arch shaped.

According to the cover film provided by the present application, by providing the plurality of concaves with an arched structure on the cover film, the flexible display device changes a light path less during a bending process, and rainbow ripples or water ripples can be avoided, thereby improving user experience. In addition, since the plurality of concaves are the arched structures with a certain radian, the plurality of concaves have a certain concentrating effect, which can converge stray light or scattered light that has not been utilized effectively before, so that brightness of a visible region of the flexible display device can be enhanced and the user experience can be further improved.

Further, a specific shape of the first portion (an arch) is not required, for example, the shape of the first portion is spherical or groove-shaped. When the cover film that includes the light incident surface having the plurality of concaves with the arched structure is applied to the flexible display device, the plurality of concaves provided continuously on the light incident surface changes a force-bearing structure of the light incident surface, and the plurality of concaves have a relatively strong compressive resistance property, and a basic structure shape may generate a relatively strong restoring force when pressed. When the flexible display device is bent, the plurality of concaves where a stress is accumulated may withstand a large deformation pressure, while the pressure may be transmitted to peripheral concaves by using a solid medium filled in the plurality of concaves to disperse the pressure, which jointly forms a restoring force against the restoring force, so that the stress is diffused from a relatively small part to a relatively large region, thereby avoiding the peeling caused by local overstretching.

Further, a radian of the first portion (the arch) is less than or equal to π. A height of the first portion may be set according to a distance between the light incident surface and the light exit surface. A diameter of a maximum cross section of the first portion may be set according to a wire of a Thin Film Transistor (TFT) or a pattern of an OLED light emitting layer. For example, the height of the first portion is positively correlated with the distance between the light incident surface and the light exit surface.

Exemplarily, the height of the first portion (the arch) is from 10 μm to 25 μm; and the diameter of the maximum cross section of the first portion is from 10 μm to 25 μm. The first portion in the range can ensure rigidity and flexibility of the cover film while maximizing the convergence of stray light or scattered light that has not been utilized effectively before, which enhances the brightness of the visual region of the flexible display device and improves the user experience.

Further, a distance between adjacent first portions may be designed based on uniformity and a brightness value of an overall light incident surface of a panel before the cover film is attached. For example, the distance between the adjacent first portions is from 0 μm to 50 μm. When the distance between the adjacent first portions is small and the plurality of first portions are arranged densely, a force-bearing structure of a surface of the light incident surface can be changed to a large extent, and compressive resistance property is relatively strong. When pressed, the plurality of first portions which are arranged densely generate a relatively strong restoring force and are also concentrated on the convergence of light, and the brightness of the visible region of the flexible display device made of the plurality of first portions is also relatively high. When the distance between the adjacent first portions is relatively large and the plurality of first portions are arranged sparsely, the cost of preparing the plurality of first portions is reduced, but the restoring force against the stress formed by the plurality of concaves is relatively weak. In an application process, the distance between the adjacent first portions may be set according to actual requirements.

Further, a distribution manner of the plurality of concaves is determined according to a distribution manner of a plurality of pixel units in the flexible display device. For example, the plurality of concaves correspond to the pixel units. One concave may correspond to the plurality of pixel units; or one concave corresponds to one pixel unit which may be a single pixel unit or a Red, Green and Blue (RGB) pixel unit; or one concave corresponds to a sub-pixel in one pixel unit; or one concave corresponds to some sub-pixels in different pixel units.

Figure 2:
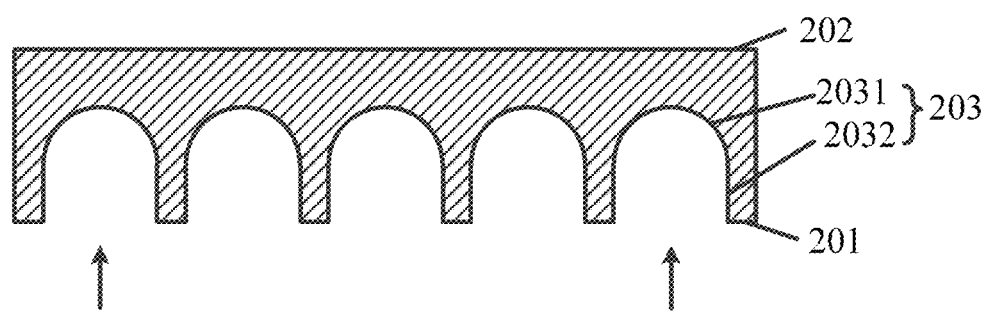
FIG. 2 is a front cross-sectional view of a cover film according to another embodiment of the present application.

Further, FIG. 2 is a front cross-sectional view of a cover film according to another embodiment of the present application. As shown in FIG. 2, the cover film includes a light incident surface 201 and a light exit surface 202 and a plurality of concaves 203 provided on one side of the light incident surface 201 in a direction toward the light exit surface 202. Each of the concaves 203 includes not only a first portion (an arch) 2031 but also a second portion 2032. The second portion 2032 is located between the first portion 2031 and the light incident surface 201. The second portion 2032 can further disperse deformation pressure that is subjected by the flexible display device. When the flexible display device is bent, not only the first portion 2031 of the concave can transmit and disperse the pressure to peripheral concaves, but also the second portion 2032 of the concave can transmit the pressure to other portions.

Figure 3A:
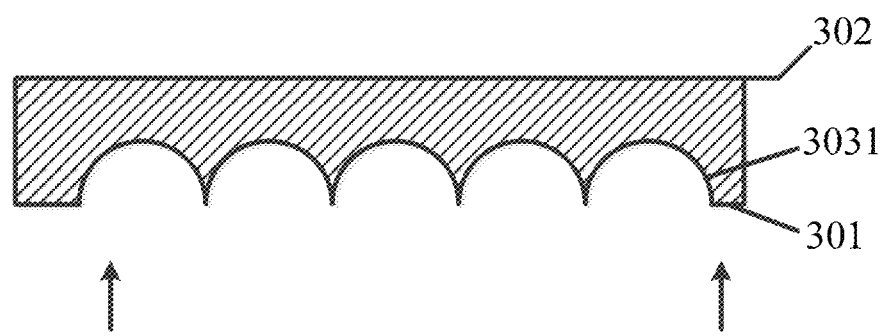
FIG. 3A is a front cross-sectional view of a cover film according to another embodiment of the present application.
Figure 3B:
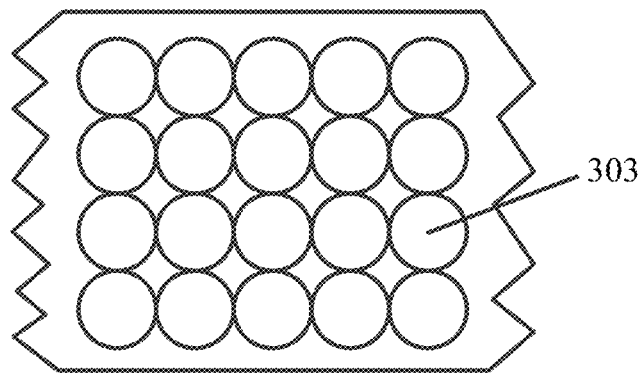
FIG. 3B is a bottom view of the cover film corresponding to FIG. 3A.

FIG. 3A is a front cross-sectional view of a cover film according to another embodiment of the present application. FIG. 3B is a bottom view of the cover film corresponding to FIG. 3A. As shown in FIG. 3A, the cover film in the embodiment includes a light incident surface 301 and a light exit surface 302 and a plurality of concaves 303 provided on one side of the light incident surface 301 in a direction toward the light exit surface 302. Each of the concaves 303 only includes a first portion (an arch) 3031, and the shape of which may be hemispherical, or may be spherical with an inferior arc in a longitudinal section. As shown in FIG. 3B, a plurality of first portions 3031 are arranged densely, and a distance between adjacent first portions 3031 is zero. The plurality of first portions 3031 arranged densely can change a force-bearing structure of a surface of the light incident surface 301 to the maximum extent and has a strongest compressive resistance property, the restoring force generated when pressed is strongest, the convergence of light is the most concentrated, and the brightness of the visual region of the flexible display device made of the plurality of first portions 3031 is largest.

Figure 4A:
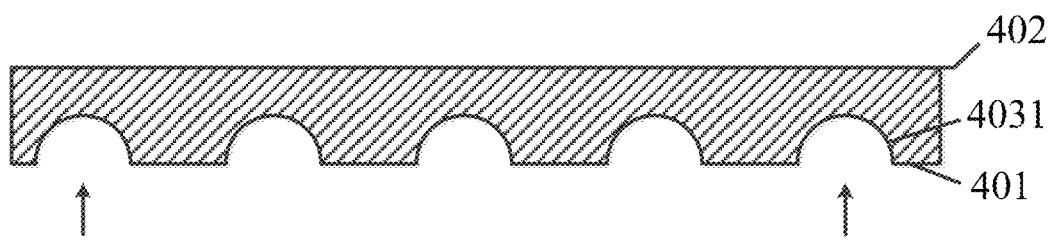
FIG. 4A is a front cross-sectional view of a cover film according to another embodiment of the present application.
Figure 4B:
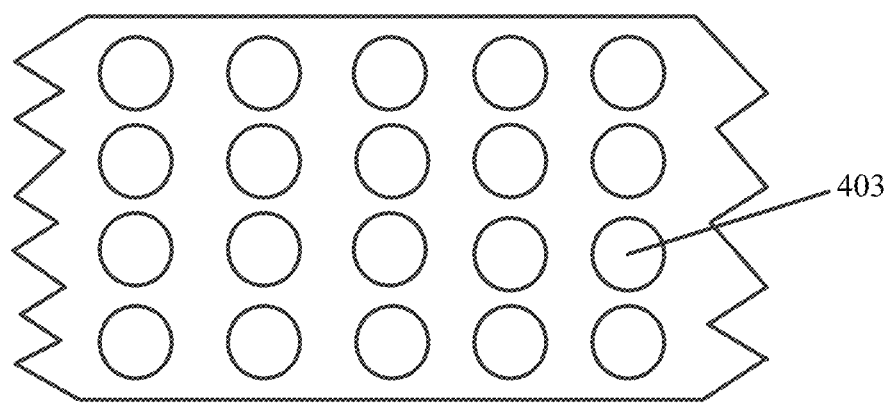
FIG. 4B is a bottom view of the cover film corresponding to FIG. 4A.

FIG. 4A is a front cross-sectional view of a cover film according to another embodiment of the present application. FIG. 4B is a bottom view of the cover film corresponding to FIG. 4A. As shown in FIG. 4A, the cover film in the embodiment includes a light incident surface 401, a light exit surface 402 and a plurality of concaves 403 provided on one side of the light incident surface 401 in a direction toward the light exit surface 402. Each of the concaves 403 only includes a first portion (an arch) 4031, and the shape of which may be hemispherical, or may be spherical with an inferior arc in a longitudinal section. As shown in FIG. 4B, a distance between adjacent first portions 4031 is large. Exemplarily, the distance between the adjacent first portions 4031 is about 1.2 times a diameter of a maximum cross section of the plurality of first portions 4031. The cover film in the present embodiment has a lower cost than the above-described first portions 3031 arranged densely, but the restoring force against stress formed by the plurality of concaves is relatively weak. In an application process, the distance between the adjacent first portions 4031 may be set according to actual requirements.

Figure 5A:
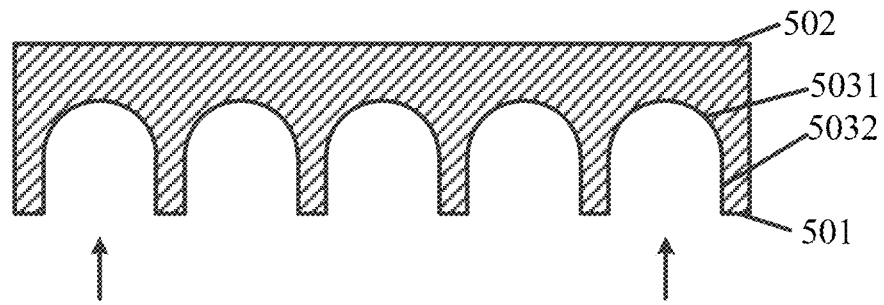
FIG. 5A is a front cross-sectional view of a cover film according to another embodiment of the present application.
Figure 5B:
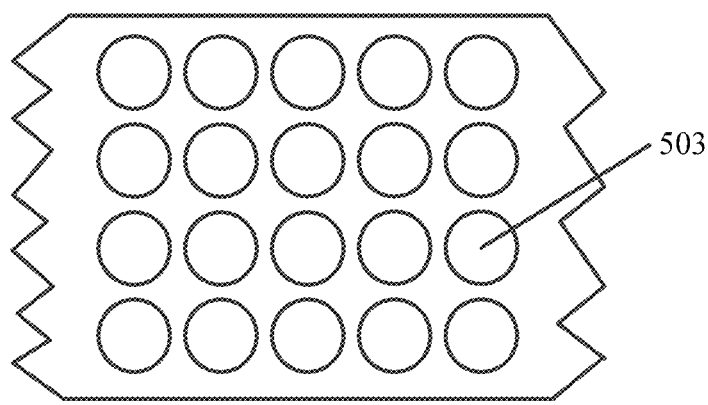
FIG. 5B is a bottom view of the cover film corresponding to FIG. 5A.

FIG. 5A is a front cross-sectional view of a cover film according to another embodiment of the present application. FIG. 5B is a bottom view of the cover film corresponding to FIG. 5A. As shown in FIG. 5A, the cover film includes a light incident surface 501, a light exit surface 502 and a plurality of concaves 503 provided on one side of the light incident surface 501 in a direction toward the light exit surface 502. Each of the concaves 503 includes a first portion (an arch) 5031 and a second portion 5032 located between the first portion 5031 and the light incident surface 501. The shape of the first portion 5031 may be hemispherical or spherical with an inferior arc in a longitudinal section. A longitudinal section of the second portion 5032 is rectangular, and a shape of the second portion 5032 is cylindrical.

In the embodiment, not only the first portion (the arch) 5031 of each of the concaves 503 can transmit the deformation pressure that is subjected by the flexible display device to peripheral concaves to disperse the pressure, but also the second portion 5032 of each of the concaves 503 can further disperse the deformation pressure that is subjected by the flexible display device. When the flexible display device is bent, the second portion 5032 of each of the concaves 503 can transmit the received pressure to a lower display module, so that the flexible display device can better disperse the pressure, and the flexible display device as a whole forms a relatively large restoring force against stress together to prevent the cover film from being peeled off due to local overstretching.

Figure 6A:
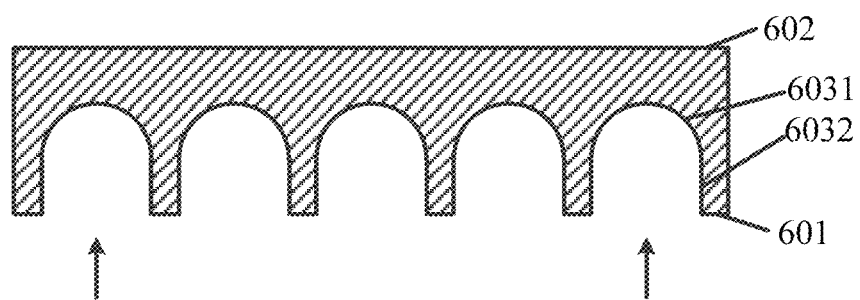
FIG. 6A is a front cross-sectional view of a cover film according to another embodiment of the present application.
Figure 6B:
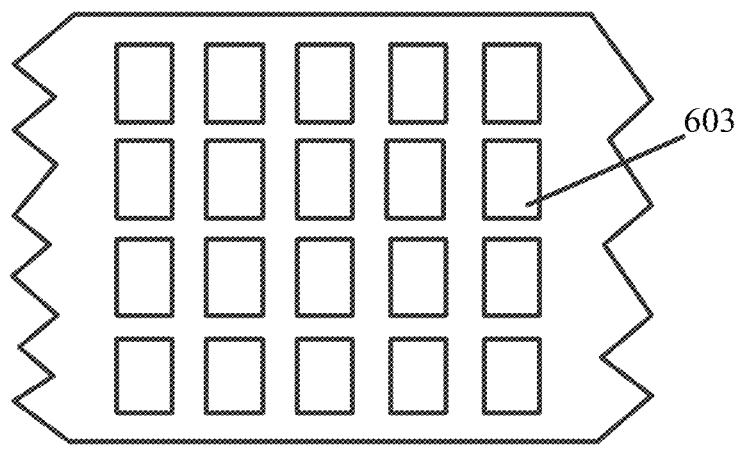
FIG. 6B is a bottom view of the cover film corresponding to FIG. 6A.

FIG. 6A is a front cross-sectional view of a cover film according to another embodiment of the present application. FIG. 6B is a bottom view of the cover film corresponding to FIG. 6A. As shown in FIG. 6A, the cover film in the embodiment is a variation of the embodiment in FIG. 5A and FIG. 5B. In the embodiment, a shape of the first portion (the arch) 6031 of the cover film is groove-shaped, and a longitudinal section of the second portion 6032 is still rectangular. However, a shape of the second portion 6032 is prismatic, a bottom view of the cover film is as shown in FIG. 6B, and the prismatic shape may be cuboid, and a cross section of the second portion 6032 is also rectangular. The second portion 6032 of the cover film in the embodiment can also transmit the deformation pressure that is subjected by the flexible display device when bending to the lower display module, thereby dispersing pressure better.

Figure 7:
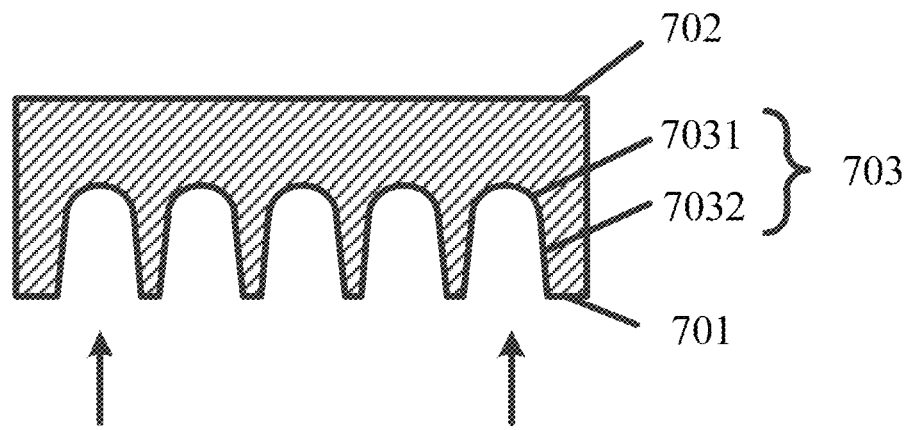
FIG. 7 is a front cross-sectional view of a cover film according to still another embodiment of the present application.

FIG. 7 is a front cross-sectional view of a cover film according to still another embodiment of the present application. As shown in FIG. 7, the cover film includes a light incident surface 701 and a light exit surface 702. A plurality of concaves 703 are provided on one side of the light incident surface 701 in a direction toward the light exit surface 702. Each of the concaves 703 includes a first portion (an arch) 7031 and a second portion 7032 between the first portion 7031 and the light incident surface 701. A shape of the first portion 7031 may be hemispherical or spherical with an inferior arc in a longitudinal section or groove-shaped. A longitudinal section of the second portion 7032 may be trapezoidal, and a shape of the second portion 7032 may be frustum of a cone or prismatic. The second portion 7032 of each of the concaves in the embodiment can further disperse the deformation pressure that is subjected by the flexible display device. When the flexible display device is bent, not only the first portion 7031 of each of the concaves can transmit the received pressure to peripheral concaves, but also the second portion 7032 of each of the concaves can transmit the received pressure to a lower display module, so that the flexible display device can disperse the pressure better. Furthermore, the second portion 7032 can reflect a part of the pressure into a medium of the cover film through the light incident surface, so that the flexible display device can disperse the pressure better and prevent the cover film from being peeled off due to local overstretching. In addition, the second portion 7032 increases a contact area between a solid medium filled in the plurality of concaves and the display module, thereby further strengthening an adhesive force between the cover film and the display module.

Figure 8:
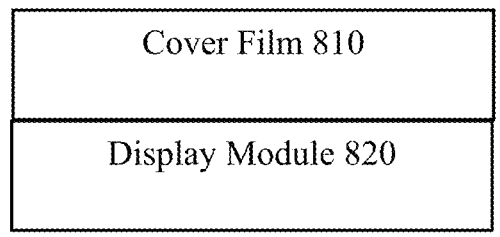
FIG. 8 is a schematic structural diagram of a flexible display device according to an embodiment of the present application.

FIG. 8 is a schematic structural diagram of a flexible display device according to an embodiment of the present application.

Referring to FIG. 8, the flexible display device includes a cover film 810 and a display module 820. The cover film 810 is provided on the display module 820.

For example, the display module 820 may be an OLED module. The cover film 810 may be adhered to an outer surface of the OLED module by using glue. Since a plurality of concaves of the cover film are also filled with the glue, and therefore, the cover film may be prevented from being peeled off during a bending process of the OLED module.

Figure 9A:
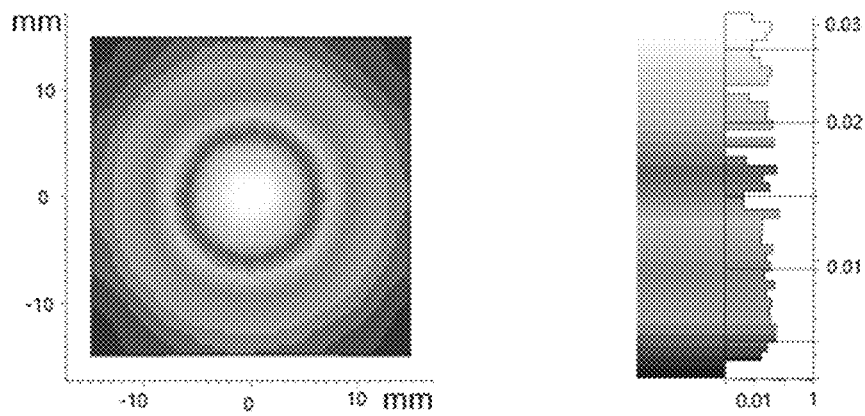
FIG. 9A is a simulation effect diagram of a point light source passing through a cover film with no concave structure according to an embodiment of the present application.
Figure 9B:
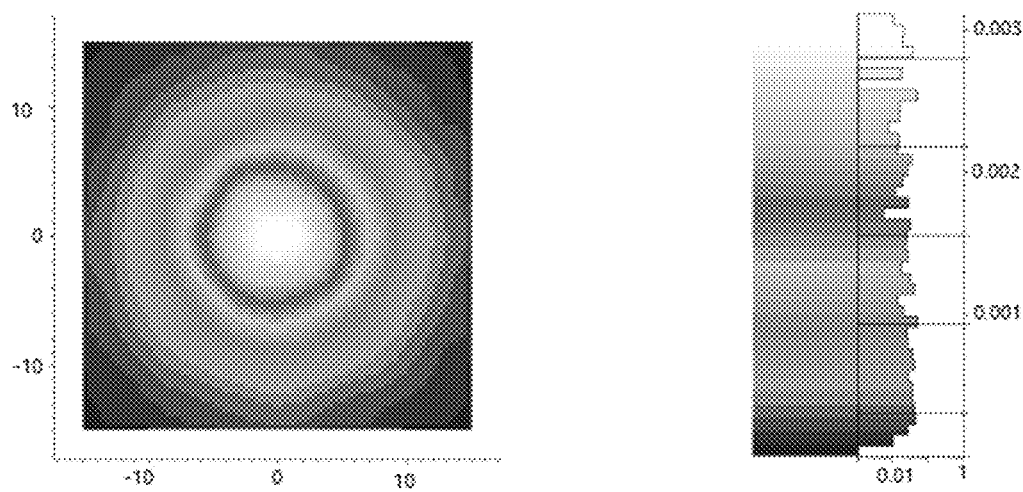
FIG. 9B is a simulation effect diagram of the point light source in FIG. 9A passing through a cover film with a concave structure.

FIG. 9A is a simulation effect diagram of a point light source passing through a cover film with no concave structure in an embodiment of the present application. FIG. 9B is a simulation effect diagram of the point light source in FIG. 9A passing through a cover film with a concave structure. As can be seen from the comparison between FIG. 9A and FIG. 9B, the brightness at an edge decreases after a light of the point light source is passed through the cover film with the concave structure compared with the point light source passing through the cover film with no concave structure (The left picture of FIG. 9A is compared with the left picture of FIG. 9B), which shows that the light scattered at a periphery is concentrated in the center. In addition, the light also becomes regionally homogenized (The right picture of FIG. 9A is compared with the right picture of FIG. 9B). The concave structure in the embodiment of the present application has a certain concentrating effect and can converge the scattered light, thereby enhancing the brightness of a visual region of the flexible display device and improving user experience.

In an embodiment of the present application, since a curved surface shape of each of the concaves has a strong self-defining characteristic, once the curved surface shape is formed, a curvature of each of the concaves is unchanged substantially. By adjusting with a luminescence angle of a module, a refractive index of a light transmission of the glue and the curvature of each of the concaves, a refraction change of the light may be maintained within a reasonable range when the plurality of concaves are squeezed, so that the occurrence of the ripple is reduced as much as possible.

In addition, the first portion (the arch) with a certain radian can converge the light source to increase the brightness of the visible region of the display device. Further, in order to homogenize the light, a diffusion film, such as a Polymethyl Methacrylate (PMMA) plate, may also be provided on one side of the light exit surface. The diffusion film can homogenize the light in the visible region of the display device while serving as a protective film. Alternatively, PMMA particles may be added or a concave-convex pattern may be embossed directly to the light exit surface of the cover film, which may also homogenize the light in the visible region of the display device to improve the user experience.

The above are only the preferred embodiments of the present application and are not configured to limit the scope of the present application. Any modifications, equivalent substitutions, improvements and so on made within the spirit and principles of the present application should be included within the scope of the present application.

What is claimed is:

1. A cover film, applied to a flexible display device, comprising a light incident surface and a light exit surface; wherein a plurality of concaves are provided on the light incident surface, each of the concaves comprises a first portion of an arch shape; and
wherein a diameter of a maximum cross section of the first portion is from 10 μm to 25 μm.

2. The cover film according to claim 1, wherein a radian of the first portion is less than or equal to π.

3. The cover film according to claim 1, wherein a height of the first portion is positively correlated with a distance between the light incident surface and the light exit surface.

4. The cover film according to claim 3, wherein the height of the first portion is from 10 μm to 25 μm.

5. The cover film according to claim 1, wherein a shape of the first portion is spherical or groove-shaped.

6. The cover film according to claim 1, wherein a distance between adjacent first portions is 1.2 times a diameter of a maximum cross section of the first portion.

7. The cover film according to claim 1, wherein a shape of each of the concaves is hemispherical.

8. The cover film according to claim 1, wherein each of the concaves further comprises a second portion located between the first portion and the light incident surface.

9. The cover film according to claim 8, wherein a longitudinal section of the second portion is rectangular or trapezoidal.

10. The cover film according to claim 8, wherein a cross section of the second portion is rectangular or circular.

11. The cover film according to claim 1, wherein a diffusion film is provided on the light exit surface.

12. A flexible display device, comprising:
a display module; and
a cover film provided on the display module;
wherein the cover film comprises a light incident surface and a light exit surface; a plurality of concaves are provided on the light incident surface, each of the concaves comprises a first portion of an arch shape; and
wherein a diameter of a maximum cross section of the first portion is from 10 μm to 25 μm.

13. The flexible display device according to claim 12, wherein a radian of the first portion is less than or equal to π.

14. The flexible display device according to claim 12, wherein a height of the first portion is positively correlated with a distance between the light incident surface and the light exit surface.

15. The flexible display device according to claim 14, wherein the height of the first portion is from 10 μm to 25 μm.

16. The flexible display device according to claim 12, wherein a shape of the first portion is spherical or groove-shaped.

17. The flexible display device according to claim 12, wherein a distance between adjacent first portions is 1.2 times a diameter of a maximum cross section of the first portion.

18. The flexible display device according to claim 12, wherein the display module comprises a plurality of pixel units; and a distribution of the plurality of concaves corresponds to a distribution of the plurality of pixel units.

* * * * *